United States Patent
Driemel

(10) Patent No.: US 10,545,203 B2
(45) Date of Patent: Jan. 28, 2020

(54) HEAD-NECK COIL WITH TILTING FUNCTION

(71) Applicant: Daniel Driemel, Oederan (DE)

(72) Inventor: Daniel Driemel, Oederan (DE)

(73) Assignee: Siemens Aktiengesellschaft, München (DE)

(*) Notice: Subject to any disclaimer, the term of this patent is extended or adjusted under 35 U.S.C. 154(b) by 957 days.

(21) Appl. No.: 14/465,019

(22) Filed: Aug. 21, 2014

(65) Prior Publication Data
US 2015/0057527 A1 Feb. 26, 2015

(30) Foreign Application Priority Data
Aug. 22, 2013 (DE) .................. 10 2013 216 686

(51) Int. Cl.
| | | |
|---|---|---|
| A61B 5/055 | (2006.01) | |
| G01R 33/34 | (2006.01) | |
| G01R 33/36 | (2006.01) | |
| G01R 33/385 | (2006.01) | |
| G01R 33/483 | (2006.01) | |

(52) U.S. Cl.
CPC ... *G01R 33/34084* (2013.01); *G01R 33/3642* (2013.01); *G01R 33/385* (2013.01); *G01R 33/4833* (2013.01); *G01R 33/34046* (2013.01)

(58) Field of Classification Search
USPC ................................. 600/421, 422
See application file for complete search history.

(56) References Cited

U.S. PATENT DOCUMENTS

| | | | | |
|---|---|---|---|---|
| 4,209,473 A | * | 6/1980 | Coyne | ............ C08J 9/06 264/175 |
| 5,905,378 A | * | 5/1999 | Giaquinto | ........ G01R 33/34084 324/318 |
| 6,037,773 A | * | 3/2000 | Mitsumata | ....... G01R 33/34046 324/300 |
| 6,577,888 B1 | | 6/2003 | Chan et al. | |
| 6,591,128 B1 | * | 7/2003 | Wu | ............... G01R 33/34084 324/318 |
| 6,980,002 B1 | | 12/2005 | Petropoulos et al. | |
| 2010/0068901 A1 | * | 3/2010 | Yumi | ................. H01R 13/03 439/78 |
| 2010/0329414 A1 | * | 12/2010 | Zhu | ..................... A61N 5/10 378/4 |
| 2013/0023756 A1 | | 1/2013 | Driemel et al. | |

(Continued)

FOREIGN PATENT DOCUMENTS

| | | |
|---|---|---|
| DE | 10 2004 052 943 A1 | 6/2005 |
| DE | 102004052943 | 6/2005 |

(Continued)

OTHER PUBLICATIONS

German Office Action dated Apr. 22, 2014 in corresponding German Patent Application No. DE 10 2013 216 686.9 with English translation.

*Primary Examiner* — Ruth S Smith
(74) *Attorney, Agent, or Firm* — Lempia Summerfield Katz LLC

(57) ABSTRACT

A local coil for a magnetic resonance imaging system has a head part and a neck part. The head part is tiltable in a tilting movement. The neck part is movable relative to the head part for compensation of the tilting movement. The local coil is a head-neck local coil.

24 Claims, 8 Drawing Sheets

(56) References Cited

U.S. PATENT DOCUMENTS

2013/0131498 A1\* 5/2013 Taracila ........... G01R 33/34084
  600/422
2013/0184563 A1 7/2013 Driemel
2013/0307535 A1\* 11/2013 Taracila ............. G01R 33/3415
  324/307

FOREIGN PATENT DOCUMENTS

| DE | 10 2011 079 565 A1 | 1/2013 |
| DE | 10 2011 079 575 A1 | 1/2013 |
| DE | 102011079565 | 1/2013 |
| DE | 102011079575 | 1/2013 |

\* cited by examiner

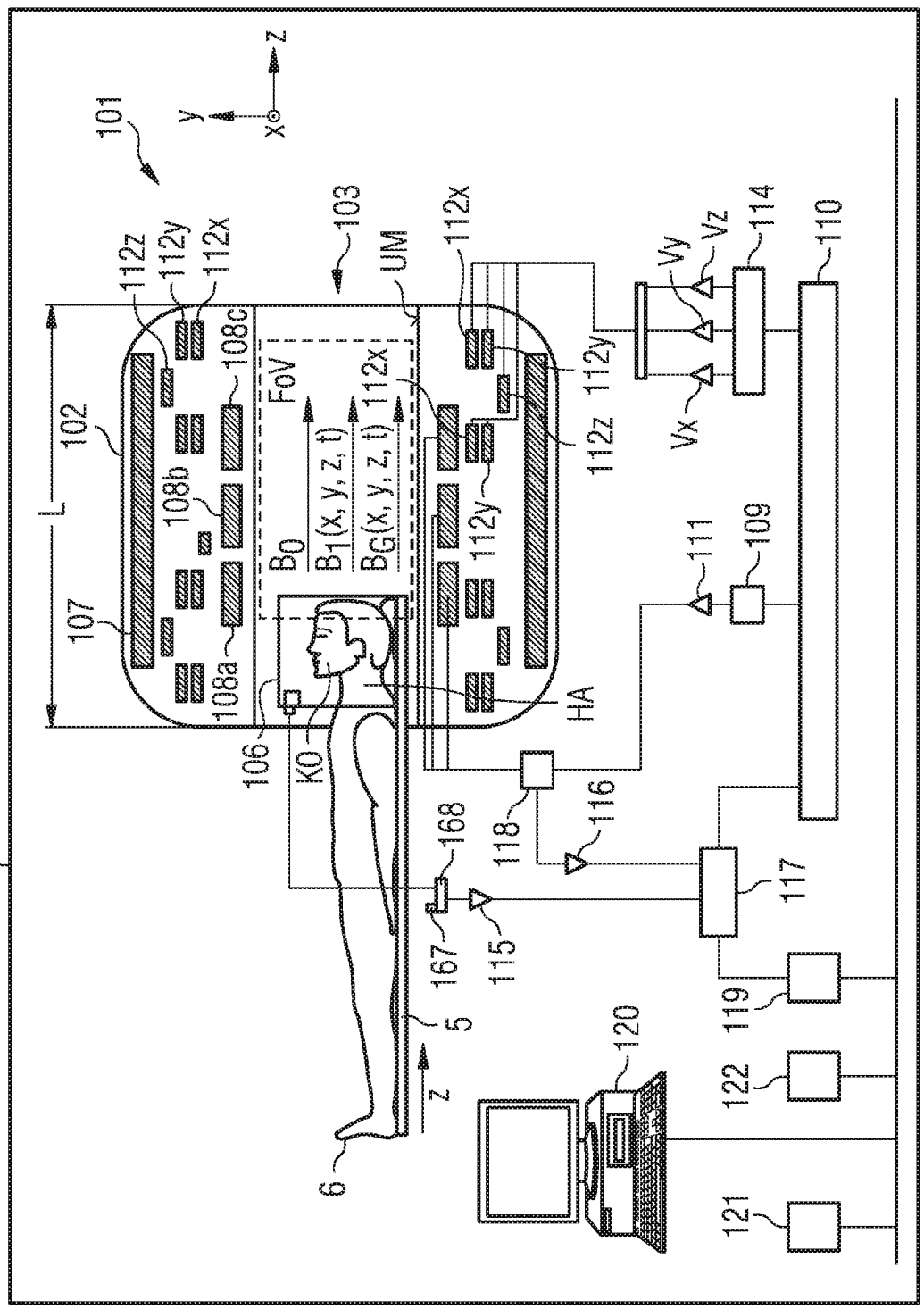

HEAD-NECK COIL WITH TILTING FUNCTION

This application claims the benefit of DE 102013216686.9, filed on Aug. 22, 2013, which is hereby incorporated by reference in its entirety.

FIELD

The disclosed embodiments relate to a head-neck coil.

BACKGROUND

Magnetic resonance imaging (MRI) apparatuses for examining objects or patients by magnetic resonance imaging are described in DE 10 2011 079 565 and DE 10 2011 079 575.

SUMMARY

The scope of the present invention is defined solely by the appended claims and is not affected to any degree by the statements within this summary.

The present embodiments may obviate one or more of the drawbacks or limitations in the related art. For example, the disclosed embodiments may optimize a head-neck coil.

BRIEF DESCRIPTION OF THE DRAWINGS

FIG. 8 is a schematic view of an MRI system in accordance with one embodiment.

DETAILED DESCRIPTION

Figure 1:
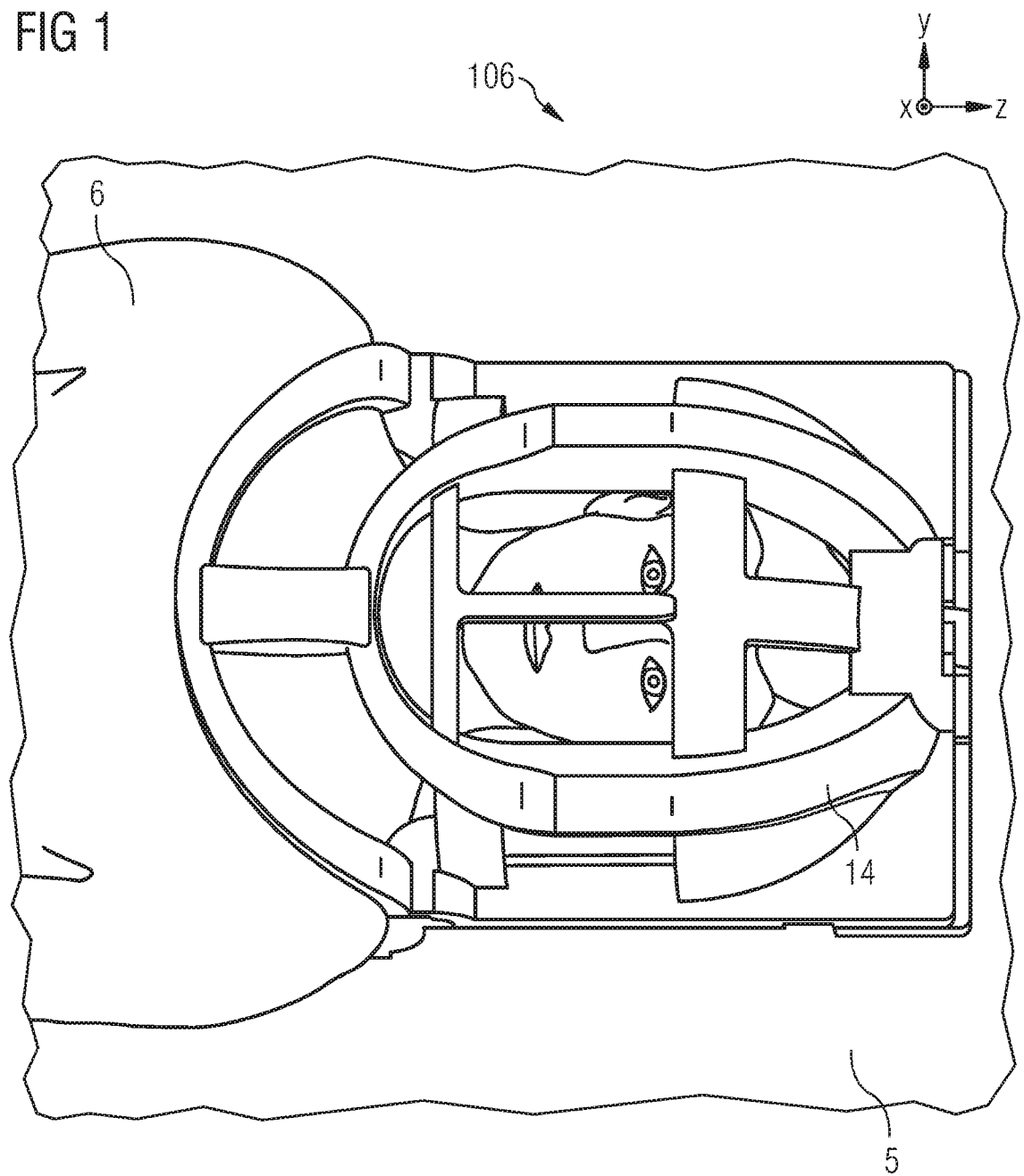
FIG. 1 is a plan view of a head-neck coil in accordance with one embodiment.

FIG. 8 shows a magnetic resonance imaging (MRI) apparatus 101 disposed in a shielded area or Faraday cage F. The MRI apparatus 101 includes a whole body coil 102 with a space 103 (e.g., tubular space), into which a patient couch 5 with a body, e.g., of an examination object 6 (e.g., of a patient) may be moved. The MRI apparatus 101 may be provided with or without a local coil arrangement 106. The patient couch 5 may be moved in the direction of the arrow z in order to generate recordings of the patient 6 via an imaging method. A local coil arrangement 106 is arranged on the patient and may be used to generate, in a local region (also called field of view or FOV) of the MRI apparatus, recordings of a partial region of the body 6 in the FOV. Signals of the local coil arrangement 106 may be evaluated (e.g., converted into images, stored or displayed) by an evaluation device 168, 115, 117, 119, 120, 121, or other evaluation device of the MRI apparatus 101. The evaluation device may be connected to the local coil arrangement 106 via, e.g., coaxial cables, by radio 167 or other connections.

In order to use the MRI apparatus 101 to examine a body 6 (an examination object or a patient) via magnetic resonance imaging, various magnetic fields coordinated with one another in terms of their temporal and spatial characteristic are radiated onto the body 6. A strong magnet (e.g., a cryomagnet 107) in a measuring cabin having an opening 103, e.g., in the form of a tunnel, generates a static strong main magnetic field $B_0$, which has a value of, e.g., 0.2 tesla to 3 teslas or more. A body 6 to be examined is laid on a patient couch 5 and moved into a region of the main magnetic field $B_0$, which is approximately homogeneous in the field of view FOV. The nuclear spins of atomic nuclei of the body 6 are excited via magnetic radio-frequency excitation pulses $B_1$ (x, y, z, t) which are radiated in via a radio-frequency antenna (and/or, if appropriate, a local coil arrangement). The radio-frequency antenna is illustrated in a simplified fashion here as body coil 108 having, e.g., multipartite configuration 108a, 108b, 108c. Radio-frequency excitation pulses are generated by, e.g., a pulse generating unit 109, which is controlled by a pulse sequence control unit 110. After amplification by a radio-frequency amplifier 111, the pulses are conducted to the radio-frequency antenna 108. The radio-frequency system shown in FIG. 1 is indicated schematically. More than one pulse generating unit 109, more than one radio-frequency amplifier 111 and a plurality of radio-frequency antennas 108 a, b, c may be used in MRI apparatus 101.

Furthermore, the MRI apparatus 101 has gradient coils 112x, 112y, 112z, by which magnetic gradient fields $B_G$ (x, y, z, t) for selective slice excitation and for spatial encoding of the measurement signal are radiated in during a measurement. The gradient coils 112x, 112y, 112z are controlled by a gradient coil control unit 114 (and, if appropriate, by amplifiers Vx, Vy, Vz), which, just like the pulse generating unit 109, is connected to the pulse sequence control unit 110.

Signals emitted by the excited nuclear spins (of the atomic nuclei in the examination object) are received by the body coil 108 and/or at least one local coil arrangement 106, amplified by assigned radio-frequency preamplifiers 116, and processed further and digitized by a receiving unit 117. The recorded measurement data are digitized and stored as complex numerical values in a k-space matrix. From the k-space matrix occupied by values, an associated MR image may be reconstructed via a multidimensional Fourier transformation.

For a coil that may be operated both in the transmission mode and in the reception mode, such as the body coil 108 or the local coil 106, the correct signal forwarding is regulated by a transmission/reception switch 118 connected upstream.

An image processing unit 119 generates an image from the measurement data. The image is displayed to a user via an operating console 120 and/or is stored in a storage unit 121. A central computer unit 122 controls the individual installation components.

In magnetic resonance (MR) imaging, images with a high signal/noise ratio (SNR) are generally recorded via so-called local coils (coils). The local coils are antenna systems that are fitted in direct proximity on (anterior) or under (posterior) the patient. During an MR measurement, the excited nuclei induce a voltage in the individual antennas of the local coil. The voltage is then amplified by a low-noise preamplifier (LNA, preamp) and is finally forwarded to the reception electronics in a cable-based manner. In order to improve the signal/noise ratio, e.g., in the case of high resolution images, high-field installations (1.5 T-12 T or more) may be used. Because the number of individual antennas that may be connected to an MR reception system is more than the number of receivers present, a switching matrix (referred to as RCCS herein) is incorporated between reception antennas and receivers. The switching matrix routes the presently active reception channels (usually those which currently lie in the field of view of the magnet) to the available receivers. As a result, more coil elements may be connected than the number of available receivers, because, in the case of whole body coverage, only the coils that are situated in the FOV or in the homogeneity volume of the magnet are read out.

"Coil" (local coil) denotes an antenna system that may include one or a plurality of antenna elements (coil elements). The antenna elements may be configured as an array coil. The individual antenna elements may be embodied as loop antennas (loops), butterfly coils or saddle coils. A coil includes, e.g., coil elements (antennas), a preamplifier, further electronics (standing wave traps, etc.) and cabling, a housing, and a cable with a plug, via which the coil is connected to the MRI installation. A receiver (RX) fitted to the installation filters and digitizes the signal received from the local coil and transfers the data to the digital signal processing device, which usually derives an image or a spectrum from the measurement and makes this available to the user for diagnosis.

Figure 2:
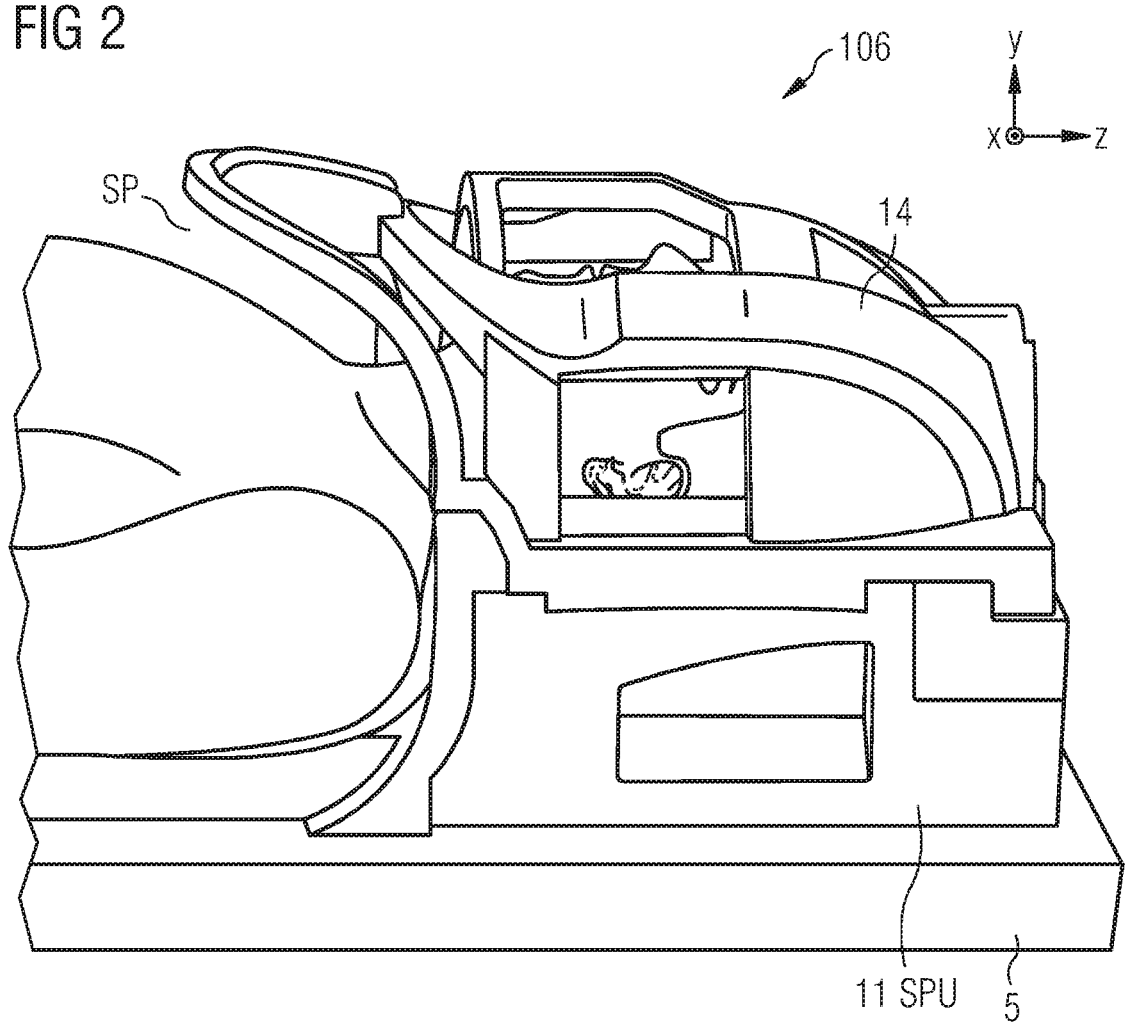
FIG. 2 is a perspective, side view of a head-neck coil in accordance with one embodiment.
Figure 3:
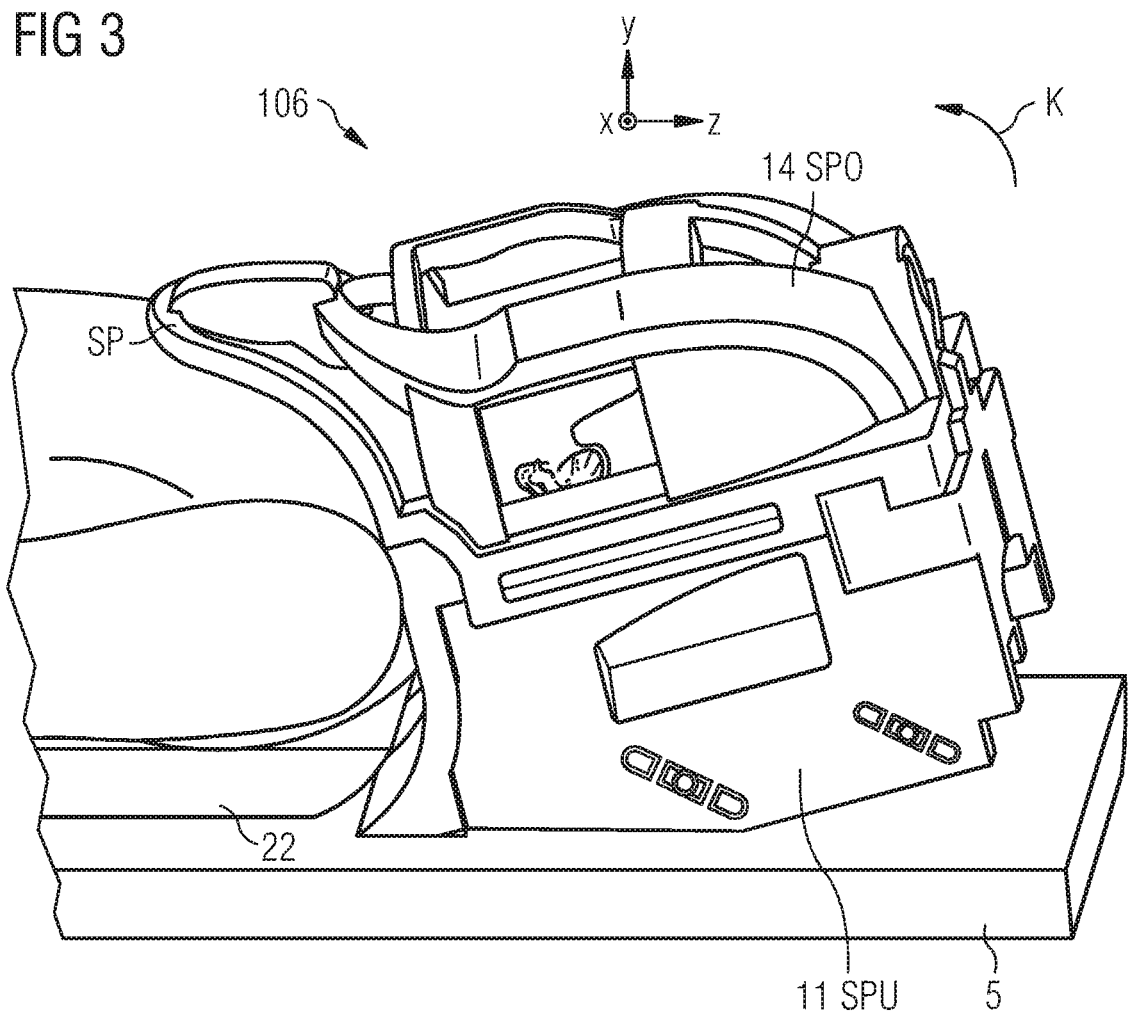
FIG. 3 is a perspective, side view of a tilted head-neck coil in accordance with one embodiment.

Head coils or combined head-neck coils as shown in FIGS. 1-3 are configured as tiltable, e.g., in order to improve patient comfort or for supporting patients having pathological changes in the cervical spinal column (Bekhterev's disease, torticollis, or other conditions). As a result, the contour of the neck coil may touch the thorax of the patient. High-channel head/neck coils, in order to bear closely against the patient, are configured with very small dimensions, for example, which may have the consequence that contact occurs at this location in connection with some patients. Contact may also occur without the head-neck coil being tilted with patients having a large upper body.

A head-neck coil, as shown in FIGS. 1-3, may be tilted only to a limited extent, if appropriate. Further, flexible neck coils are reduced to a movable flexible tab which has insufficient neck coverage and, in a plurality of time-shifted measurements, may be reproducible to a limited extent with regard to its position. These flexible tabs bear against the patient and are moved by the patient. As a result, respiration and body movements may have a restrictive influence on the image quality.

FIGS. 4-7 illustrate some aspects of exemplary embodiments of head-neck coils 106.

A combined head-neck coil 106 has a "rigid-flexible" neck part. The neck part may be flexibly adjustable and rigidly latchable, if appropriate with counter-movement K* relative to a tilting movement K, which may support the functionality, coverage of the examination region, and reproducibility of a rigid head-neck coil 106. In this case, the head-neck coil 106 may also be a local coil that is "directly plugged" (e.g., electrically connectable by insertion of a plug/socket) into the patient couch 5 of an MRI apparatus 101. The way in which a directly plugged local coil 106 may be tilted despite the fixed linking to the patent couch is described, for example, in the patent applications DE 10 2011 079 565 and DE 10 2011 079 575.

A local coil in the form of a head-neck coil 106 as shown in FIGS. 4-7 includes, e.g., a head part 1 and a flexible neck part 2 (also called movable neck part), a rigid (that is to say not (appreciably) pliable) (connecting) neck part 3 and a rigid (head coil) neck part 4 fixed to the head coil. The head-neck coil 106 is positioned on the patient couch 5 and the patient 6 lies up to the shoulder in the head-neck coil and lies, e.g., in the region of the patient shoulder on a shoulder bearing part 22. The shoulder bearing part 22 may bear on the patient couch in a planar manner even in the case of a tilted head-neck coil 106 and may or may not be connected to the lower part of the head-neck coil 106. For better entry of the patient into the local coil 106, the local coil 106 may be divided into a coil upper part 14 (also designated by SPO) and a coil lower part 11 (also designated by SPU). The coil upper part 14 may be arranged above (a direction y) the face and neck. For example, the coil upper part 14 may be detachable from the coil lower part 11, e.g., in an upward direction (the direction y). The flexible (e.g., movable and/or elastically deformable) neck part 2 of the head-neck coil 106 has a gap SP toward the thorax of the patient 6. The rigid neck parts 3 and 4 of the head-neck coil 106 are mounted rotatably with respect to one another via a rotary joint 7. The rotary joint 7 in this example has a lower stop 8 (e.g., with positively locking fit) such that a minimum opening SP of the neck coil is ensured. The minimum opening SP may be dimensioned, e.g., such that the opening offers enough space for almost all patients without tilting K of the head-neck coil 106. Consequently, most neck examinations are reproducible in this position.

Figure 4:
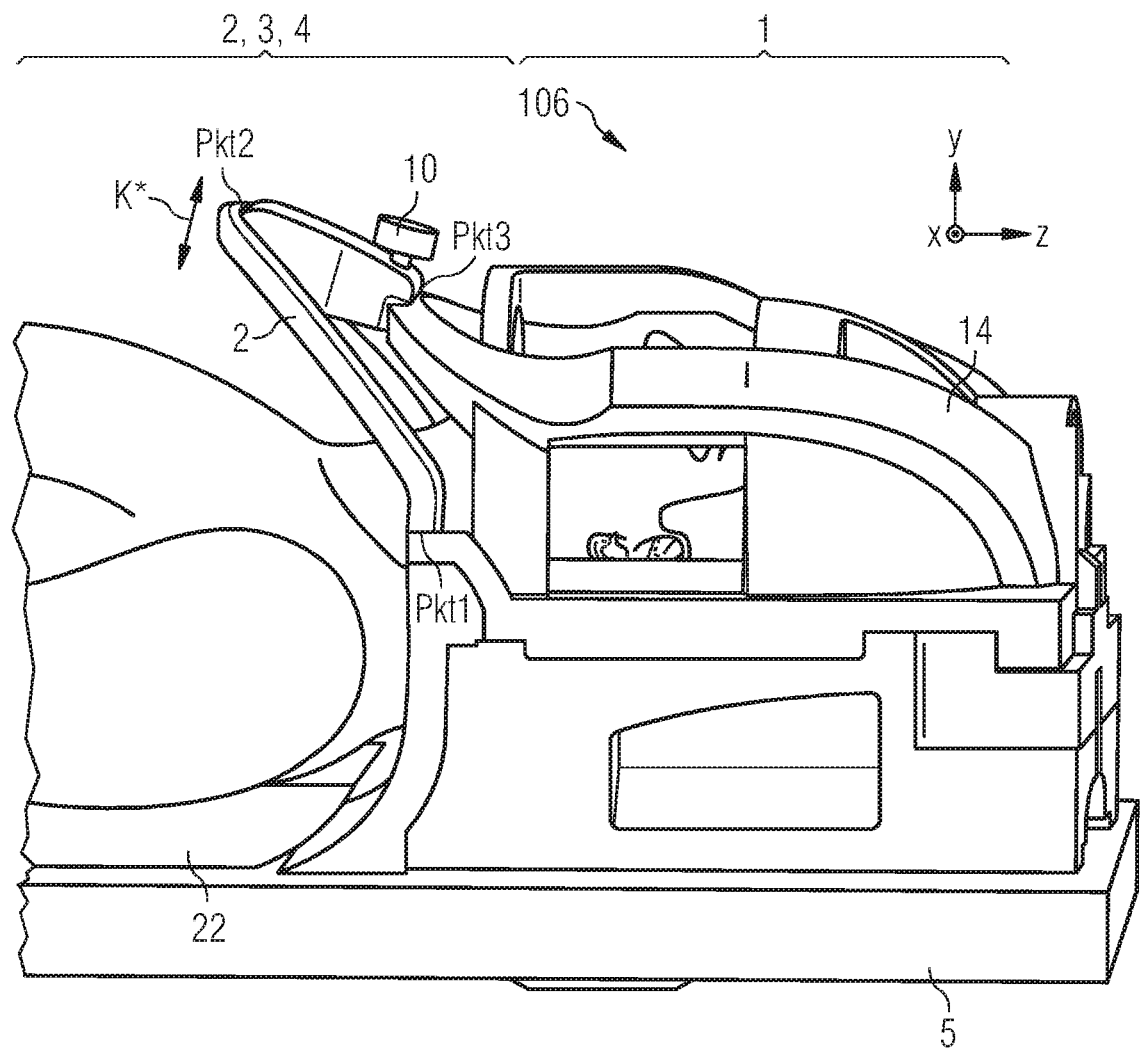
FIG. 4 is a perspective, side view of an untilted head-neck coil with an adjustable neck part in accordance with one embodiment.
Figure 5:
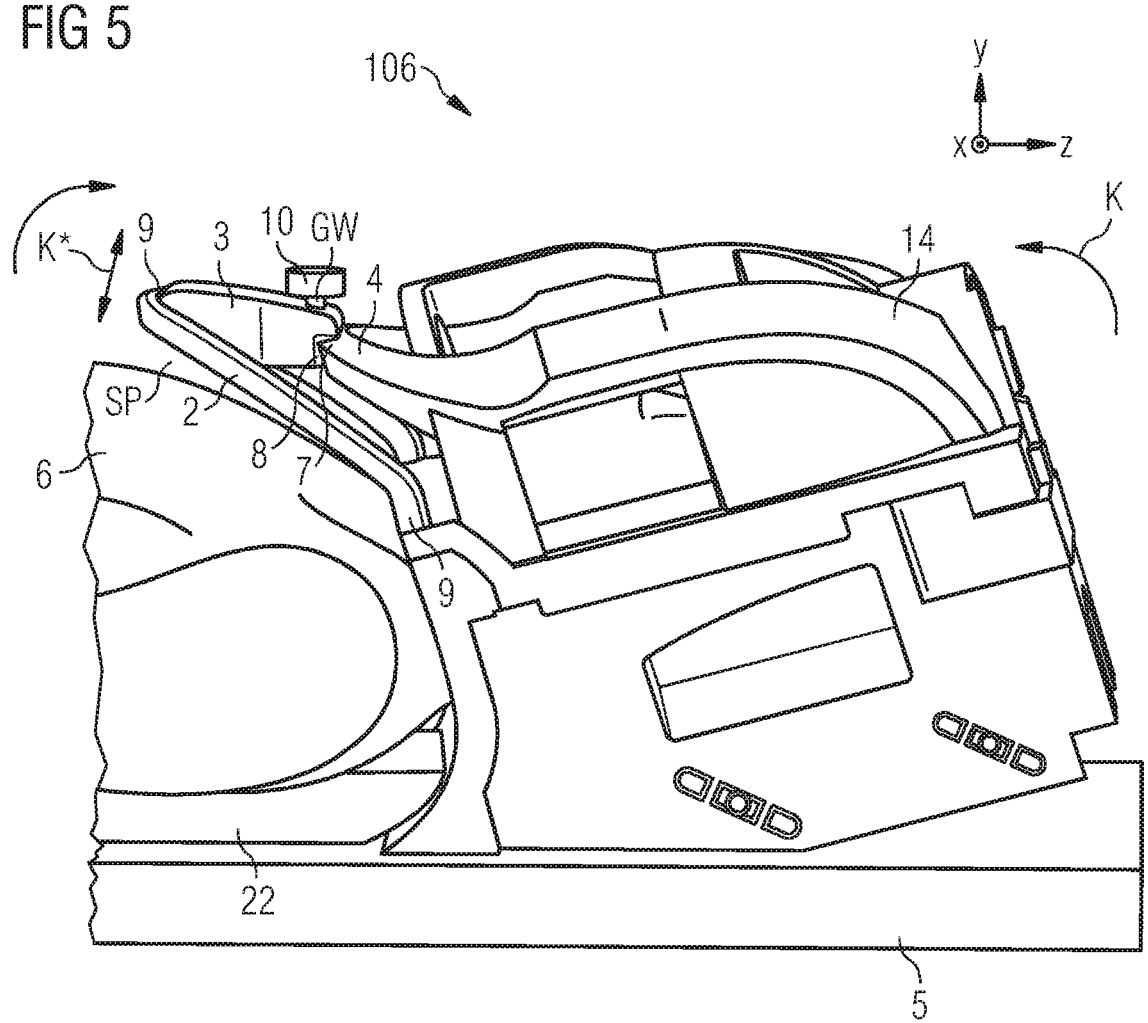
FIG. 5 is a side view of a tilted head-neck coil with an adjustable neck part in two positions in accordance with one embodiment.

If the head-neck coil 106 (e.g., the upper part 14 and/or elements 1-10) is tilted relative to the lower part 22 and/or the couch 5 in direction K from a starting position as in shown FIG. 4 into a position as shown in FIG. 5, the flexible neck part 2 may collide with and touch the patient and thereby be forced upward (the direction y). The flexible neck part 2 is clamped to the rigid neck parts 3 and 4 or mounted rotatably thereon via rotary joints 9. This mounting (e.g., at three points and/or rotation axes Pkt1, Pkt2, Pkt3) may ensure the mobility while also maintaining the original shape of the local coil 106.

Reproducibility of the examination and decoupling of the individual coil elements of the local coil 106 may be provided. The decoupling may remain constant as a result of this type of linking relative to one another.

Figure 6:
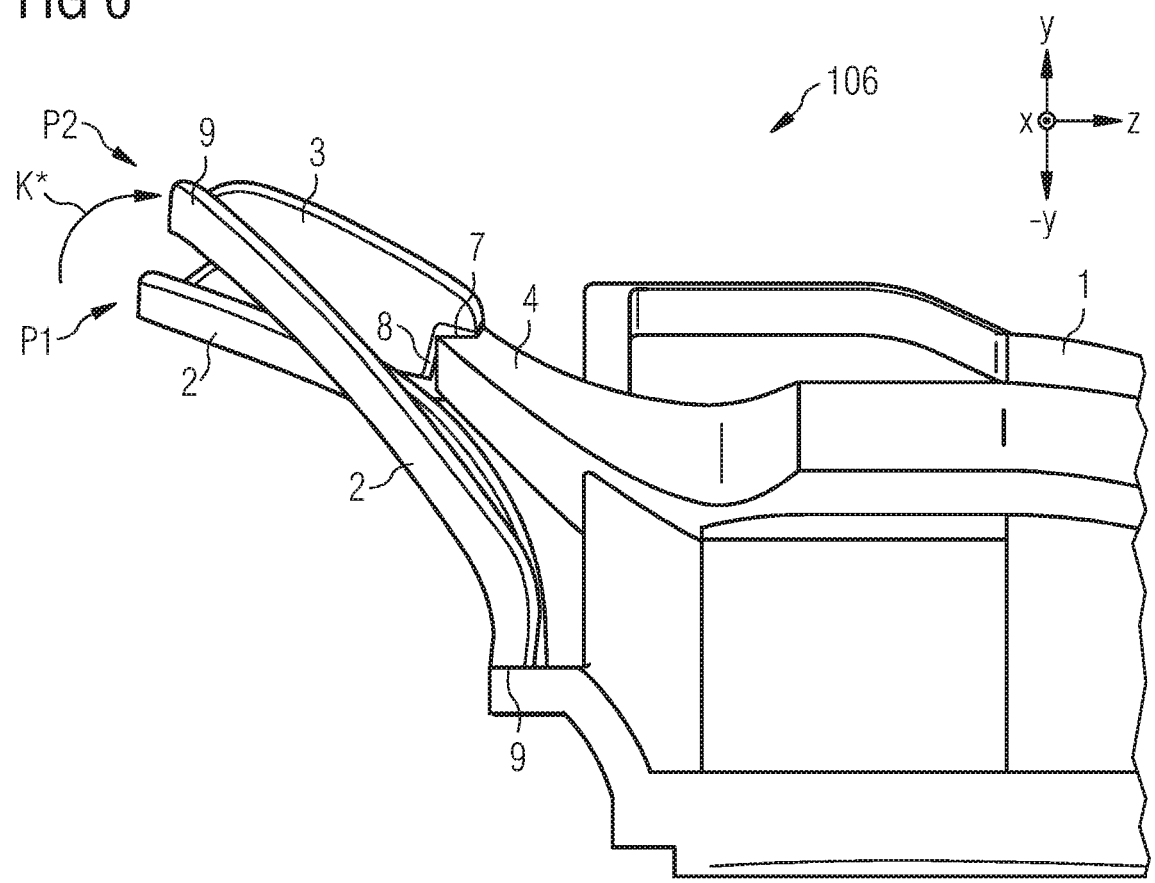
FIG. 6 is a side view of a head-neck coil with a neck part in a starting position and a neck part counter-tilted in a compensating manner by the tilting of the head-neck coil in accordance with one embodiment.
Figure 7:
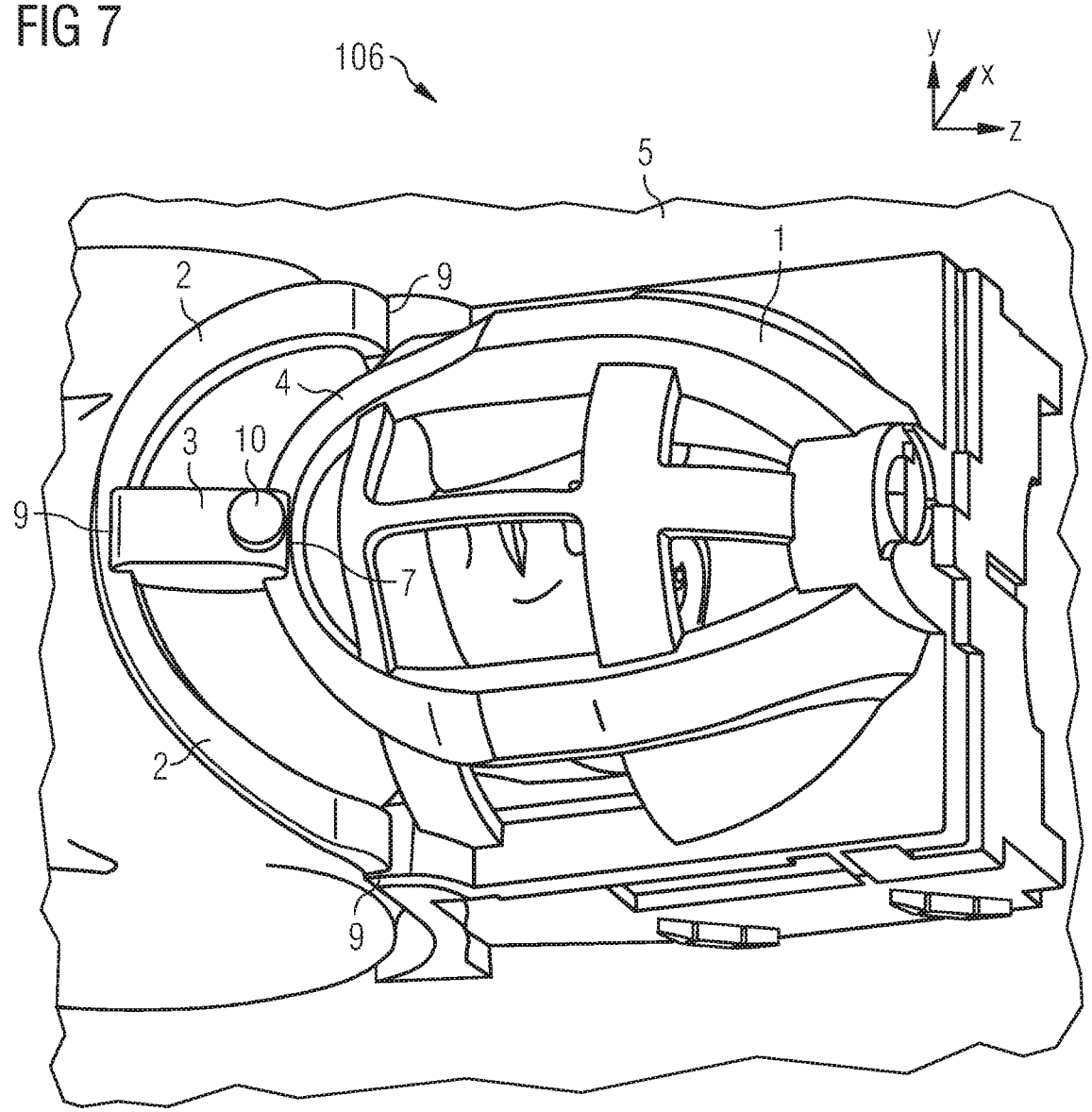
FIG. 7 is a perspective, plan view of a tilted head-neck coil with an adjustable neck part in accordance with one embodiment.

A further positive effect of this arrangement may be the direction of a movement K* of the flexible neck part 2 (also called movable neck part hereinafter) from the position P1 at the bottom of FIG. 6 into the position P2 at the top in FIG. 6. The flexible neck part 2 in this example includes flexible material (for example, polyethylene or PE foam) and is dimensioned in the stop position such that the part 2 is shaped in a bent fashion (adapted to the patient shoulder). If the upper part 14 of the head-neck coil 106 swings (in the movement K) upward (the direction y) relative to the patient couch 5, the flexible neck part 2 may stretch and move toward the patient 6 and may lead to an increase in the MR signal there.

A movement K* may be for partial or complete compensation of a movement K of the upper part 14 of the head-neck coil 106. The movement K* of the flexible neck part 2 may be driven, e.g., in the following two ways.

Firstly, a movement K* may be driven by the patient 6 as a result of the patient forcing the flexible neck part 2 upward (the direction y). That may be unpleasant under certain circumstances (in view of slight pressure) and/or respiration and body movements of the patient 6 may be transmitted to the local coil 106 and the MR images may thereby be adversely influenced.

Therefore, the movable neck part 2 may, e.g., also be moved manually. In this example, the movement is such that there is always a gap SP between thorax and neck coil. For this purpose, e.g., a user of the local coil 106 presses the flexible neck part 2 upward and clamps the rotary joint 7 via a rotary knob 10, for example. The rotary knob 10 in this example has a threaded rod GW and, by virtue of the threaded rod GW, reaches the spindle of the rotary joint 7 and fixedly clamps the threaded rod GW. Consequently, the head-neck coil fixes itself in position. If scales are attached in each case on the rotary joint 7 and/or a device for tilting K the local coil 106, these positions are precisely reproducible.

Various advantages and configurations may be provided, including those described below.

The head-neck coil 106 may enlarge the neck opening (e.g., a gap SP between the coil 106 and the neck) of the local coil 106 via a "rigid-flexible" neck part (rigid in parts and flexible in parts) for a relatively large percentage of patients (e.g., approximately 95%). The enlargement may be provided without tilting the upper part of the neck coil, e.g., a position as shown in FIG. 4, for comfortable entry of the patient into the head-neck coil 106.

An element coupling may be provided via a division of the neck coil into, e.g., a flexible part 2 and rigid parts 3 and 4, and may be, for example, flexible for size adjustment, may be rigid for geometrically constant linking to the head coil.

A movement of a complete neck coil arrangement that comprehensively represents this body region may thus be achieved. A movement of the neck parts 2, 3, 4 of the head-neck coil 106 via the rotary joint 7 with a defined starting position (minimum opening SP of the neck coil) via a lower stop 8 for a reproducible position (e.g., of the clip-type flexible neck part 2 with, if appropriate, antenna(s) therein) may be provided.

Contact of the local coil 106 with the patient 6 in the starting position may be avoided such that no movement artifacts occur.

A freedom of movement of the neck coil despite a plurality of links 7 and 9 to the rigid coil part 3, 4 may be provided as a result of a specific arrangement of rotary joints.

Clamps or rotary joints 9 may ensure that the neck coil is mounted movably but nevertheless in a manner as positionally fixed as possible. As a result, the shape of the local coil 106 (e.g., parts 2, 3, 4) is maintained during the movement and the linking to the rigid part has constant geometrical conditions, which may be advantageous for the decoupling of the individual coil elements.

A configuration of the local coil 106 with a plurality of links to the rigid part 4 may establish antenna connections (connections from antennas to a controller of the local coil or to the MRI apparatus 101, or other connections) at this location because the flexible part does not move away (to a relevant extent) from the rest of the local coil 106. The coverage of the examination region (to be examined by MRI imaging) of the patient 6 may be maintained even in the case of movement of the local coil 106. This prevents areas that are not covered by antenna elements from arising in the region of the patient to be examined, which may be advantageous for image homogeneity during MRI imaging.

A plurality of links between the flexible part 2 and rigid part(s) 3, 4 of the local coil 106 may result in greater design latitude with regard to the coil geometry and number of antenna elements (in the local coil).

A fixing of the rotary joint 7 may make it possible to establish the opened neck coil without the flexible neck part 2 touching the patient.

Movement artifacts may be avoided.

Scales on a rotary joint 7 and on elements for the head coil tilting K may enable a precise description of the setting for the reproducibility of the examination.

The flexible neck part 2 may be composed of flexible material, such as PE foam.

The flexible neck part 2 is bent in one example in the starting position (in order to form a (free) shoulder cutout into which the shoulder may project somewhat). The flexible neck part 2 stretches toward (in the movement K*) the patient 6 upon the tilting K of the head-neck coil.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A local coil comprising:
   a head part of the local coil, the head part tiltable in a tilting movement; and
   a neck part of the local coil, the neck part movable relative to the head part for compensation of the tilting movement, the neck part comprising:
      a flexible neck part; and
      one or more rigid neck parts,
   wherein the flexible neck part is rotatably mounted to the one or more rigid neck parts via at least one first rotary joint, and
   wherein the neck part is configured such that when the head part is tilted in the tilting movement into contact with a patient, the flexible neck part is elastically deformable or both elastically deformable and movable for complete or partial compensation of the tilting movement, such that the flexible neck part elastically deforms or moves in response to the contact with the patient.

2. The local coil of claim 1, wherein:
   the head part and the neck part are electrically connectable to a patient couch of a magnetic resonance imaging (MRI) apparatus and adapted to be positioned in direct proximity to the patient, such that:
   the head part is configured for MRI of a head of the patient, is configured for mounting the head of the patient in the head part, or is both configured for the MRI of the head of the patient and configured for mounting the head of the patient in the head part; and
   the neck part is configured for the MRI of a neck of the patient, is disposed above the neck of the patient, or is both configured for the MRI of a neck of the patient and disposed above the neck of the patient.

3. The local coil of claim 1, further comprising:
a coil lower part,
wherein the local coil is connectable to a patient couch, and wherein the head part is tiltable in the tilting movement relative to the patient couch, the coil lower part, or both the patient couch and the coil lower part.

4. The local coil of claim 1, wherein the neck part is movable with enlargement of a gap between the patient and the neck part.

5. The local coil of claim 1, wherein the elastically deformable flexible neck part is entirely composed of a flexible material.

6. The local coil of claim 5, wherein the flexible material comprises polyethylene foam.

7. The local coil of claim 1, wherein the neck part is pivotable about a second rotary joint on the head part, on the neck part fixed to the head part, or both on the head part and on the neck part fixed to the head part.

8. The local coil of claim 7, wherein the neck part is pivotable with enlargement, reduction, or both enlargement and reduction of a gap between the patient and the neck part.

9. The local coil of claim 1, wherein the one or more rigid neck parts are mounted rotatably with respect to one another.

10. The local coil of claim 9, wherein the one or more rigid neck parts are mounted rotatably with respect to one another via a second rotary joint.

11. The local coil of claim 1, wherein the neck part is movable relative to the head part in a direction having a vertical component.

12. The local coil of claim 1, wherein a second rotary joint between the one or more rigid neck parts comprises a lower stop bit.

13. The local coil of claim 12, wherein the lower stop bit is configured to define a minimum opening of a neck coil.

14. The local coil of claim 1, wherein the neck part is manually movable.

15. The local coil of claim 1, wherein the neck part is clampable in a position into which the neck part is movable.

16. The local coil of claim 15, wherein the neck part is clampable via a rotary knob on a second rotary joint.

17. The local coil of claim 1, further comprising a rotary knob via which the neck part is clampable in a position into which the neck part is movable, the rotary knob comprising a threaded rod, and wherein a spindle of a second rotary joint is clampable, fixable, or both clampable and fixable via the threaded rod.

18. The local coil of claim 17, further comprising one or more scales arranged on the second rotary joint, the one or more scales indicating the extent of a tilting of the local coil.

19. The local coil of claim 1, wherein the at least one first rotary joint comprises two or more first rotary joints, and wherein the neck part is connected to the head part via the two or more first rotary joints.

20. The local coil of claim 19, wherein the two or more first rotary joints have rotation axes that are parallel to one another but remote from one another.

21. The local coil of claim 1, wherein the head part and the neck part are electrically connectable to a magnetic resonance imaging (MRI) system such that electrical connections are present, whether the head part is untilted or tilted, from a controller of the local coil, the MRI system, or both the local coil and the MRI system, to antennas in the head part, antennas in the neck part, or antennas in both the head part and the neck part.

22. The local coil of claim 1, wherein the neck part is bent in a direction at least in one position.

23. The local coil of claim 1, wherein the neck part, the one or more rigid neck parts, or both the neck part and the one or more rigid neck parts, have one or more MRI antenna elements.

24. The local coil of claim 1, wherein the local coil is configured such that the tilting movement of the head part initiates a tilting movement of the neck part relative to the head part for compensation of the tilting movement of the head part.

* * * * *